United States Patent
Lee et al.

(10) Patent No.: US 8,541,314 B2
(45) Date of Patent: Sep. 24, 2013

(54) METHOD FOR SMOOTHING GROUP III NITRIDE SEMICONDUCTOR SUBSTRATE

(75) Inventors: Wei-I Lee, Hsinchu (TW); Kuei-Ming Chen, New Taipei (TW); Yin-Hao Wu, Taichung (TW); Yen-Hsien Yeh, New Taipei (TW)

(73) Assignee: National Chiao Tung University (TW)

( * ) Notice: Subject to any disclaimer, the term of this patent is extended or adjusted under 35 U.S.C. 154(b) by 266 days.

(21) Appl. No.: 13/067,228

(22) Filed: May 18, 2011

(65) Prior Publication Data

US 2012/0184102 A1    Jul. 19, 2012

(30) Foreign Application Priority Data

Jan. 14, 2011   (TW) .............................. 100101455 A

(51) Int. Cl.
 *H01L 21/311* (2006.01)
 *H01L 21/461* (2006.01)
(52) U.S. Cl.
 USPC .......................................... 438/745; 438/754
(58) Field of Classification Search
 None
 See application file for complete search history.

(56) References Cited

U.S. PATENT DOCUMENTS

| 7,229,926 | B2 * | 6/2007 | Matsumoto | 438/691 |
|---|---|---|---|---|
| 2009/0029550 | A1 * | 1/2009 | Matsumoto | 438/691 |
| 2009/0155986 | A1 * | 6/2009 | Lee et al. | 438/478 |
| 2010/0295055 | A1 * | 11/2010 | Yamamoto | 257/76 |
| 2012/0021591 | A1 * | 1/2012 | Matsumoto | 438/507 |

OTHER PUBLICATIONS

Method for modulating the wafer bow of free-standing GaN substrates via inductively coupled plasma etching Publish: Date: Sep. 24, 2010 ; Journal of Crystal Growth.

* cited by examiner

*Primary Examiner* — Duy Deo
(74) *Attorney, Agent, or Firm* — Bacon & Thomas, PLLC

(57) ABSTRACT

The invention discloses a smoothing method to decrease bowing of group III nitride semiconductor substrate. The certain face of group III nitride semiconductor substrates is etched under the appropriate etching recipe and time, the certain morphology such as rod-type and other structures are appeared at the certain face. And such structures releases the compressive stresses at these certain faces, resulting in clearly increasing the bowing radius of the group III nitride semiconductor substrates, finally decreasing the bowing phenomenon of the group III nitride semiconductor substrate.

6 Claims, 15 Drawing Sheets

METHOD FOR SMOOTHING GROUP III NITRIDE SEMICONDUCTOR SUBSTRATE

BACKGROUND OF THE INVENTION

1. Field of the Invention

The invention relates to a smoothing method to decrease bowing of group III nitride semiconductor substrate, particularly to a smoothing method to decrease bowing of group III nitride semiconductor substrate by using an etching method.

2. Description of the Prior Art

In the manufacturing process of conventional photoelectric semiconductor element and electronic element semiconductors, particularly in the manufacturing process of single crystalline gallium nitride substrate (free-standing GaN substrates), the severe bowing phenomenon will be occurred on single crystalline nitride epitaxy layer during the heating process, due to the expansion coefficient between the heterogeneous substrate under this single crystalline nitride epitaxy layer is not matched.

In the parallel direction, the uneven line defects and point defects will be generated on the group III nitride semiconductor substrate adopted by the above-mentioned process, resulting in the bowing of group III nitride semiconductor substrate. The bowing radius is about 0.2 m to 2 m. As for 2 inch free-standing GaN substrates, the deviated distance between the centrality to the edge may be 1500 μm to 150 μm. Sometimes the deviated distance is even larger than the thickness of free-standing GaN substrates. The bowing phenomenon of free-standing GaN substrates or nitride epitaxy layer will cause the grinding rupture and uneven grinding phenomenon between the substrate and epitaxy layer, which becomes a problem waiting to be solved urgently.

In addition, in the prior art of the photoelectric semiconductor element and electronic element semiconductor technology, the methods for improving the bowing of group III nitride semiconductor substrate includes the following methods:

In Taiwan Patent No. 200423312, a selective growth of patterned nitride seed was proposed, but this method requires tedious yellow light process, and the reduction for the bowing of free-standing GaN substrates is limited, even the bowing phenomenon of free-standing GaN substrates cannot be measured in time for flexible adjustment.

In U.S. Pat. No. 7,229,926, a mechanical grinding method was proposed to grind both sides of substrate, and the dry/wet etching method was used to remove the damaged layer generated by the grinding. But this method will not decrease the bowing phenomenon of substrate, so it will result the rupture of substrate and uneven phenomenon of substrate upon grinding. This method has to grind the generated damage layer, and then the etching can be conducted to decrease the bowing phenomenon of substrate.

Summarized from the above-mentioned patents, the prior art has not mentioned the improvement level for the bowing phenomenon of free-standing GaN substrates as the heterogeneous substrate below the free-standing GaN substrates has not been removed.

Therefore, in order to the bowing phenomenon of free-standing GaN substrates more effectively, provide the industry to grasp better production process for applying in the photoelectric semiconductor element, it is necessary to research and develop innovative method to increase the yield for the production of free-standing GaN substrates and reduce the manufacturing cost of photoelectric semiconductor elements.

SUMMARY OF THE INVENTION

The invention discloses a smoothing method to decrease bowing of group III nitride semiconductor substrate; it does not need tedious semiconductor process to significantly decrease the bowing phenomenon of group III nitride semiconductor substrate.

The invention discloses a smoothing method to decrease bowing of group III nitride semiconductor substrate. The certain face of group III nitride semiconductor substrates is etched under the appropriate etching recipe and time, the certain morphology such as rod-type and other structures are appeared at the certain face. And such structures can release the compressive stresses at these certain faces, resulting in clearly increasing the bowing radius of the group III nitride semiconductor substrates, finally decreasing the bowing phenomenon of the group III nitride semiconductor substrates.

The invention can measure the bowing change of group III nitride semiconductor substrate or nitride epitaxy layer very instant, in order to carry on flexible adjustment at suitable time.

The invention can be used before or after the chemical grinding process, and other process stage of semiconductor.

The invention can be used to decrease the bowing phenomenon of convex or concave free-standing GaN substrates (nitride epitaxy layer).

After etching, the invention can obtain rod-type structure, hole-type structure, or flat-type structure etc. The above-mentioned structures can decrease the bowing phenomenon of free-standing GaN substrates, resulting in smoothing effect. The use of the above-mentioned structure will be better for the follow-up application of substrate, such as the application of grinding, epitaxy.

Therefore, the advantage and spirit of the invention can be understood further by the following detail description of invention and attached Figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The invention discloses a smoothing method to decrease bowing of group III nitride semiconductor substrate, wherein different etching methods are used to decrease the bowing phenomenon of group III nitride semiconductor substrate. The substantial embodiments are described in detail as follows:

Embodiment 1:

The invention discloses a method for smoothing a group III nitride semiconductor substrate. Firstly, the convex gallium nitride (GaN) substrate is provided. The reaction coupling plasma ion technology (dry etching technology) is used to etch the bottom of free-standing gallium nitride substrate. The chlorine ($Cl_2$) and argon (Ar) are used as the etching gases. The first etching time is 7 minutes for the first time. The follow-up etching time is accumulated by 14 minutes every time. It means the etching time is 21 minutes for the second time, 35 minutes for the third time, 49 minutes for the fourth time, 63 minutes for the fifth time, and 77 minutes for the fifth time and so on.

Figure 1:
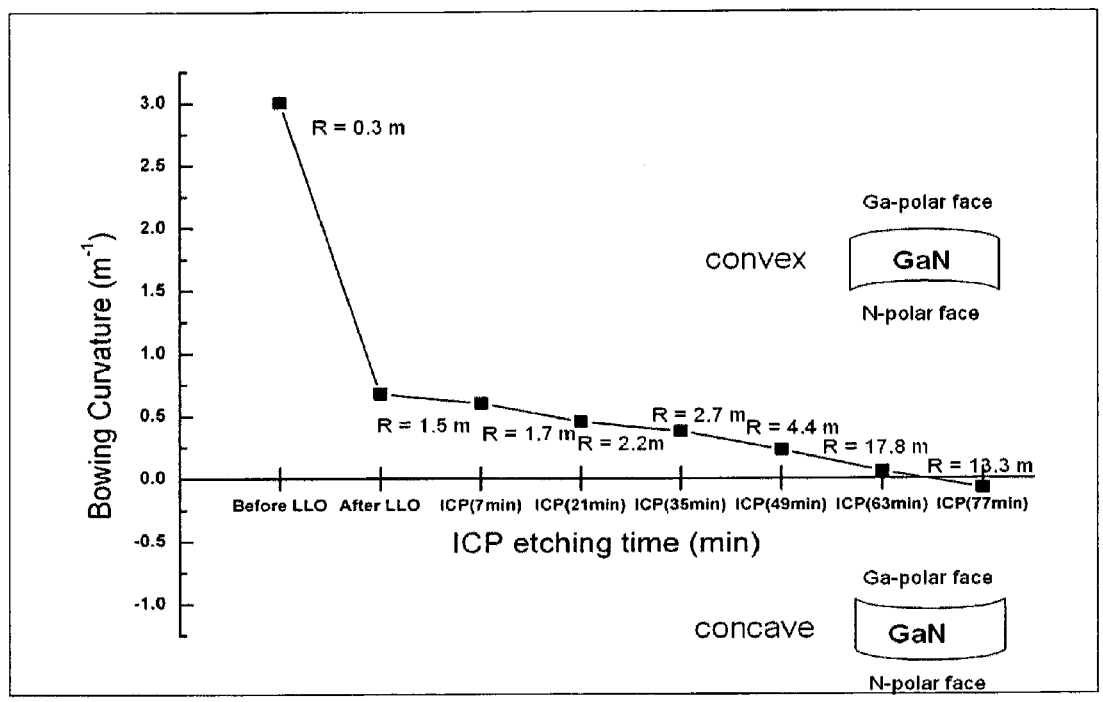
FIG. 1 shows the relation of bowing radius of convex free-standing gallium nitride substrate versus etching time before and after every etching process.

Measure the bowing radius of convex gallium nitride before and after every etching process. The relation of bowing radius versus etching time is shown in FIG. 1. In the FIG. 1, the bowing curvature is defined as the inverse of bowing radius. When the bowing curvature is smaller, the bowing radius is larger, which means the bowing level is smaller. In addition, the bowing curvature is defined as positive value for convex phenomenon and negative value for concave phenomenon. Then, as shown in FIG. 1, the bowing radius becomes larger within the etching time. When the etching time is 63 minutes, the bowing radius is 17.8 m, and the bowing phenomenon is almost disappeared. In addition, when the etching time is 77 minutes, the bowing direction is changed from concave to convex. The result shows when the etching time is certain time between 63 to 77 minutes, the free-standing GaN substrate without any bowing phenomenon can be obtained.

Figure 2A:
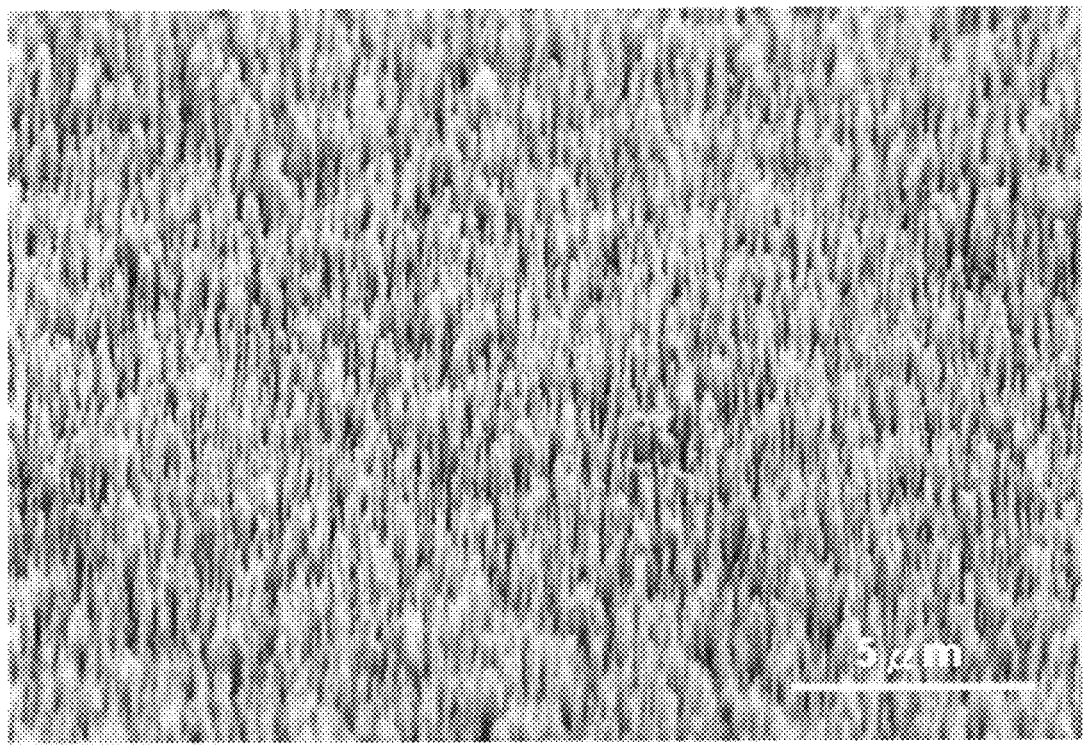
FIG. 2A and FIG. 2B are graphs illustrating the morphology change under convex free-standing gallium nitride substrate at the different etching time.
Figure 2B:
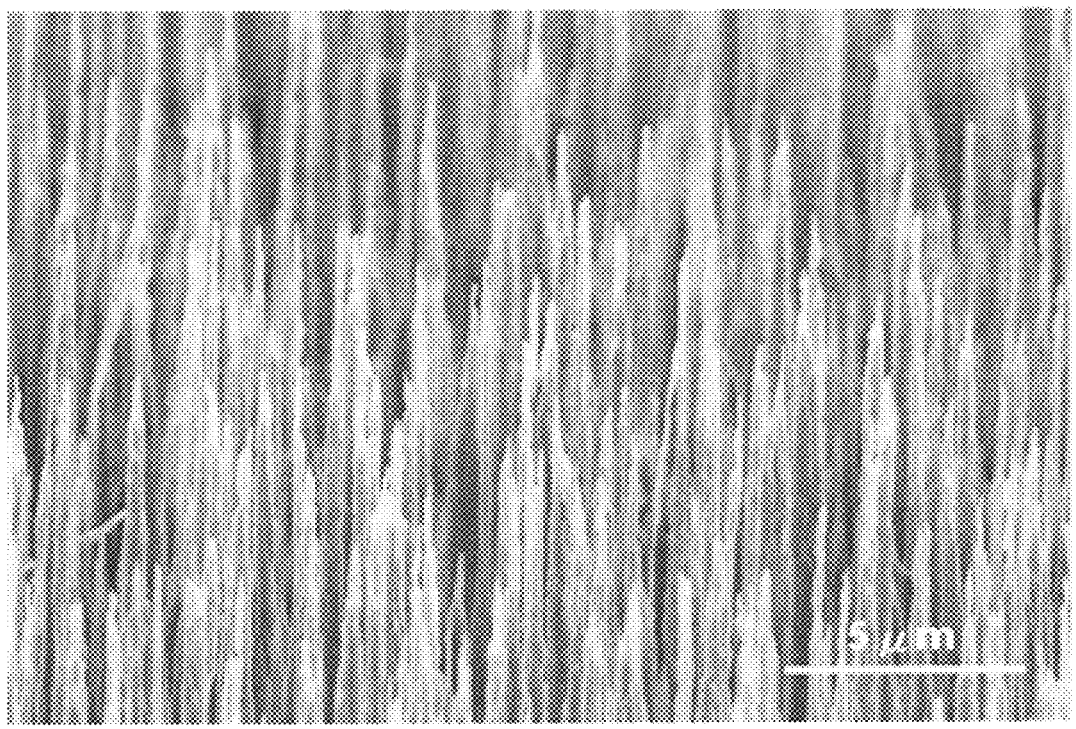

FIG. 2A and FIG. 2B are graphs illustrating the morphology change under convex free-standing GaN substrate at different etching time. FIG. 2A shows the morphology under substrate when the etching time is 7 minutes, and it is found that many rods are been generated. As shown in FIG. 2B, when the etching time is increased to 77 minutes, the length of rod will become longer.

Figure 3A:
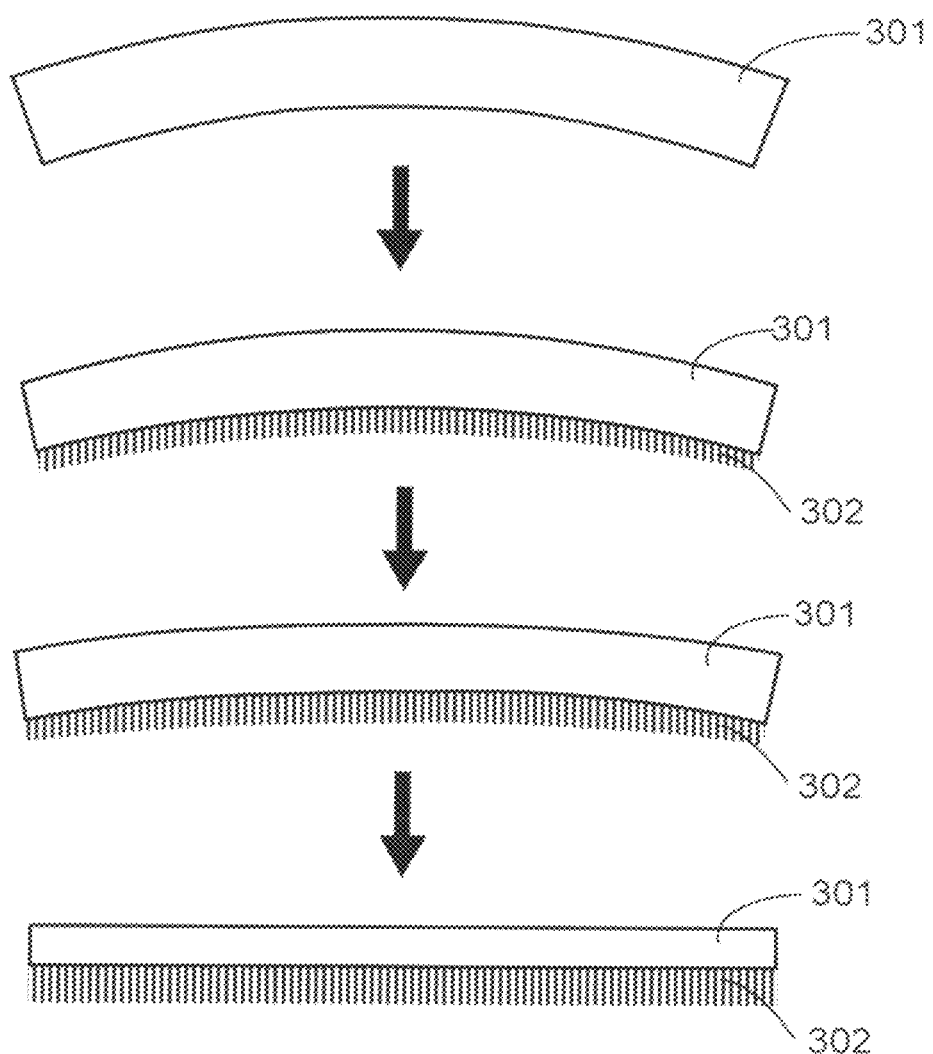
FIG. 3A shows the side view of convex free-standing gallium nitride substrate after etching.

FIG. 3A shows the side view of convex free-standing gallium nitride substrate 301 after the etching process. The convex free-standing gallium nitride substrate 301 is provided, and using a dry etching method to etch a bottom of the convex free-standing gallium nitride substrate 301. Due to the stress under the substrate 301 is released by the rod-type structure 302, so that the bowing level is decreased gradually.

Figure 3B:
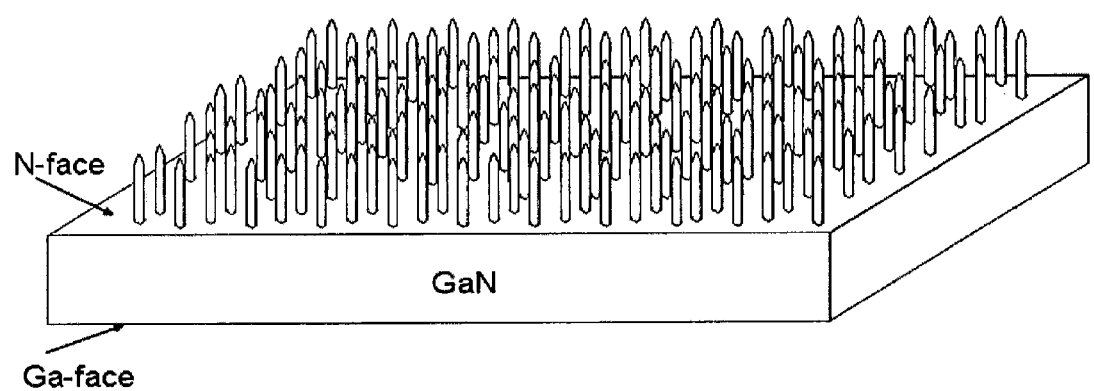
FIG. 3B shows the bowing of convex free-standing gallium nitride substrate and the isometric view of rod-type structure.

FIG. 3B shows the bowing of convex free-standing GaN substrate 301 and the isometric view of rod-type structure 302.

Figure 4:
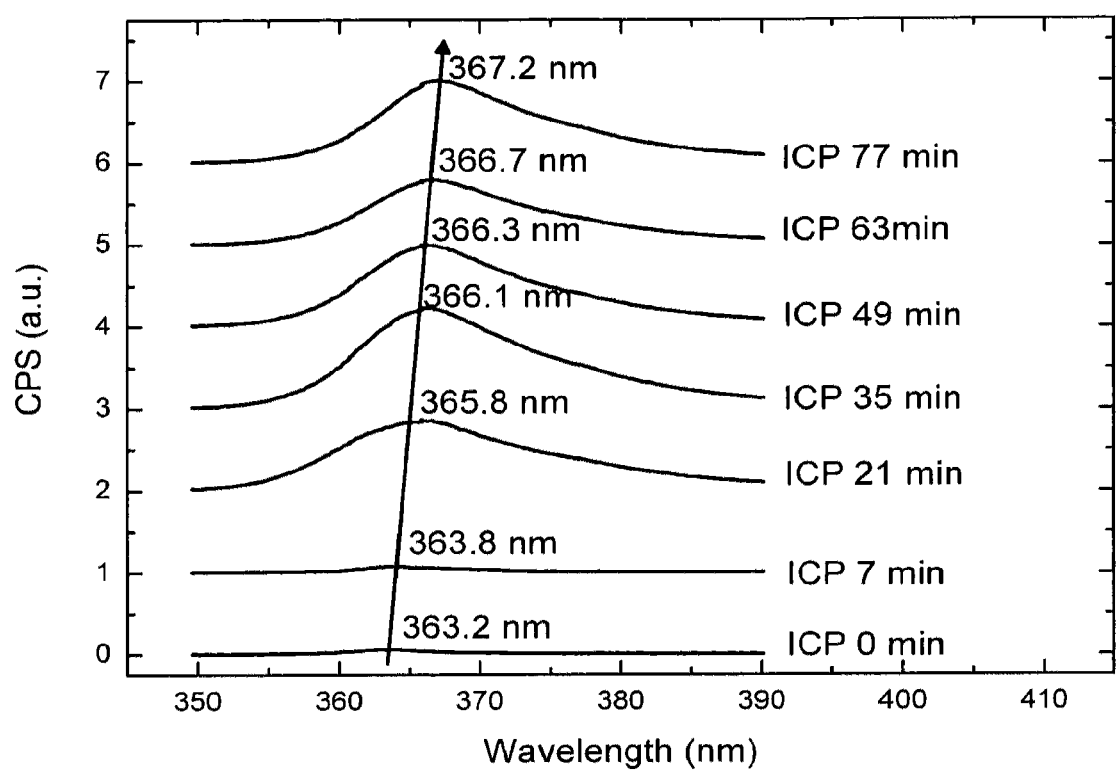
FIG. 4 shows the spectrum under convex free-standing gallium nitride substrate measured by the photoluminescence (PL).

In addition, as shown in FIG. 4, the photoluminescence (PL) is used to measure the spectrum under convex substrate. Due to the stress under convex substrate is released by the rod, from the photoluminescence spectrum it is found that the main peak value has significant red shift phenomenon, and the wavelength is shifted from 363.2 nm to 367.2 nm. The stress under substrate is actually released, so that the bowing of gallium nitride substrate is decreased. Therefore, this etching method can decrease the bowing of gallium nitride substrate, which will not break the substrate body, resulting in smoothing the group III nitride semiconductor substrate.

Embodiment 2:

The invention discloses a method for smoothing a group III nitride semiconductor substrate. Firstly, the concave free-standing gallium nitride substrate is provided. The reaction coupling plasma ion technology (dry etching technology) is used to etch the top of free-standing GaN substrate. The chlorine and argon are used as the etching gases. The etching time is 7 minutes for the first time. The follow-up etching time is accumulated by 14 minutes every time. It means the etching time is 21 minutes for the second time, 35 minutes for the third time, and 49 minutes for the fourth time and so on.

Figure 5:
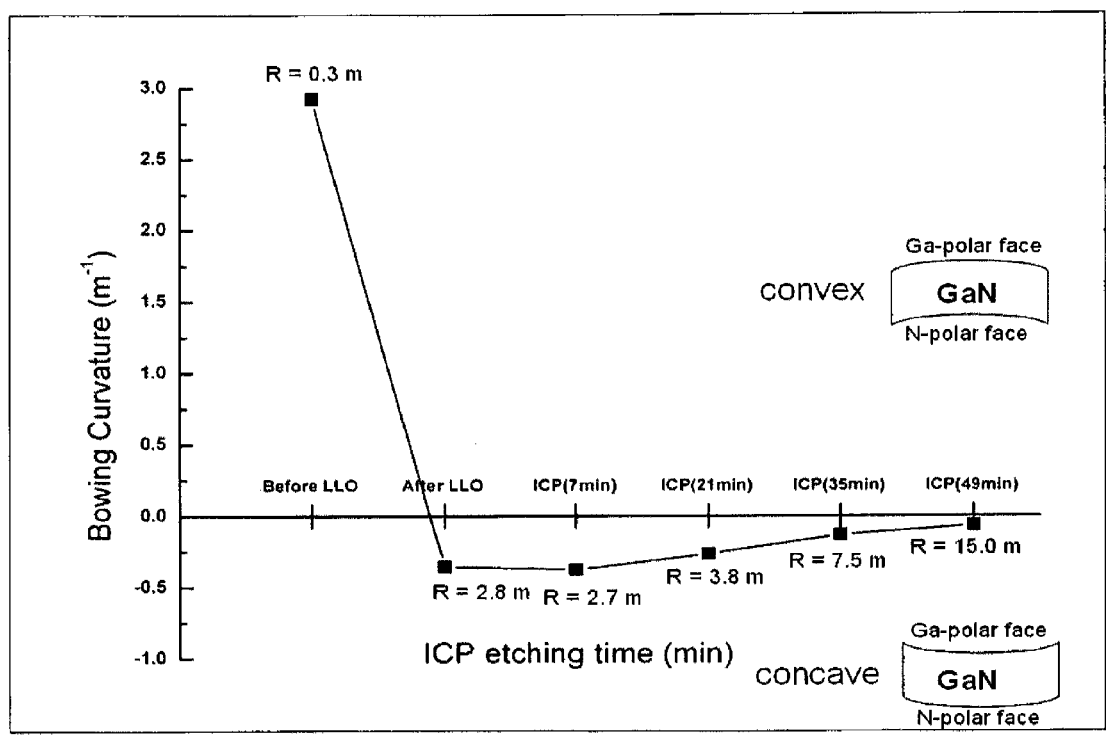
FIG. 5 shows the relation of bowing radius of concave free-standing gallium nitride substrate versus etching time before and after every etching process.

Measure the bowing radius of concave free-standing gallium nitride before and after every etching process. The relation of bowing radius versus etching time is shown in FIG. 5. It is observed that the bowing radius is changed from 2.8 m and is become larger with the etching time. When the etching time is 49 minutes, the bowing radius is 15.0 m, and the bowing phenomenon is almost disappeared.

Figure 6A:
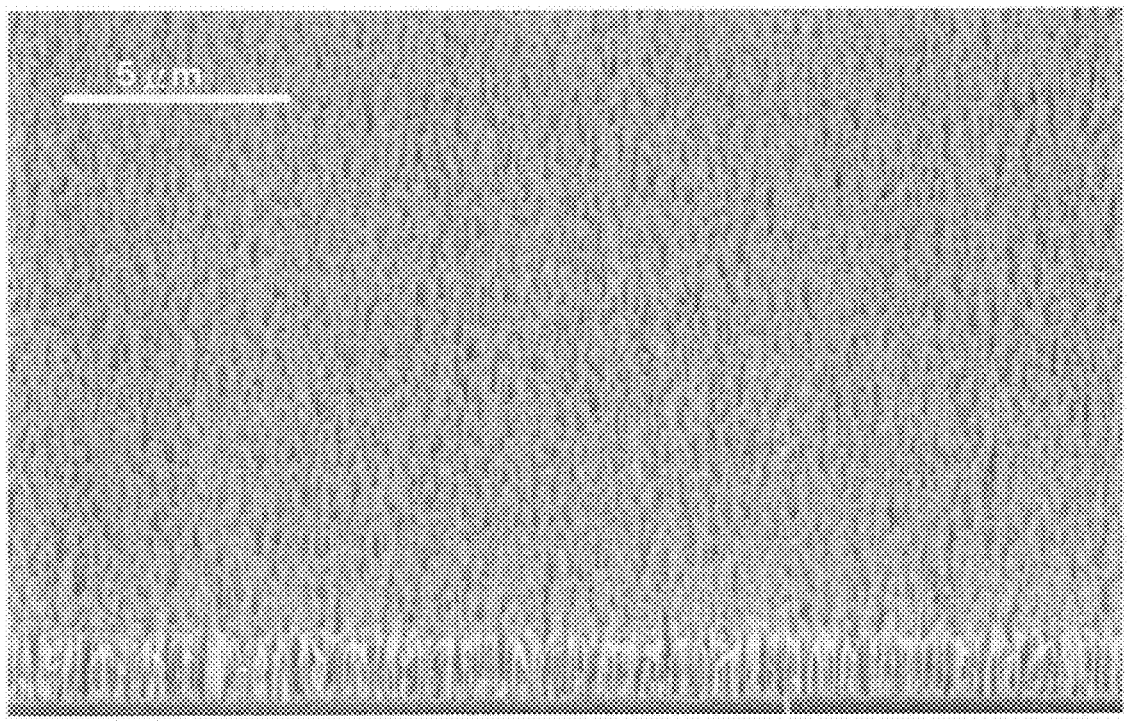
FIG. 6A and FIG. 6B are graphs illustrating the morphology change under concave free-standing gallium nitride substrate at the different etching time.
Figure 6B:
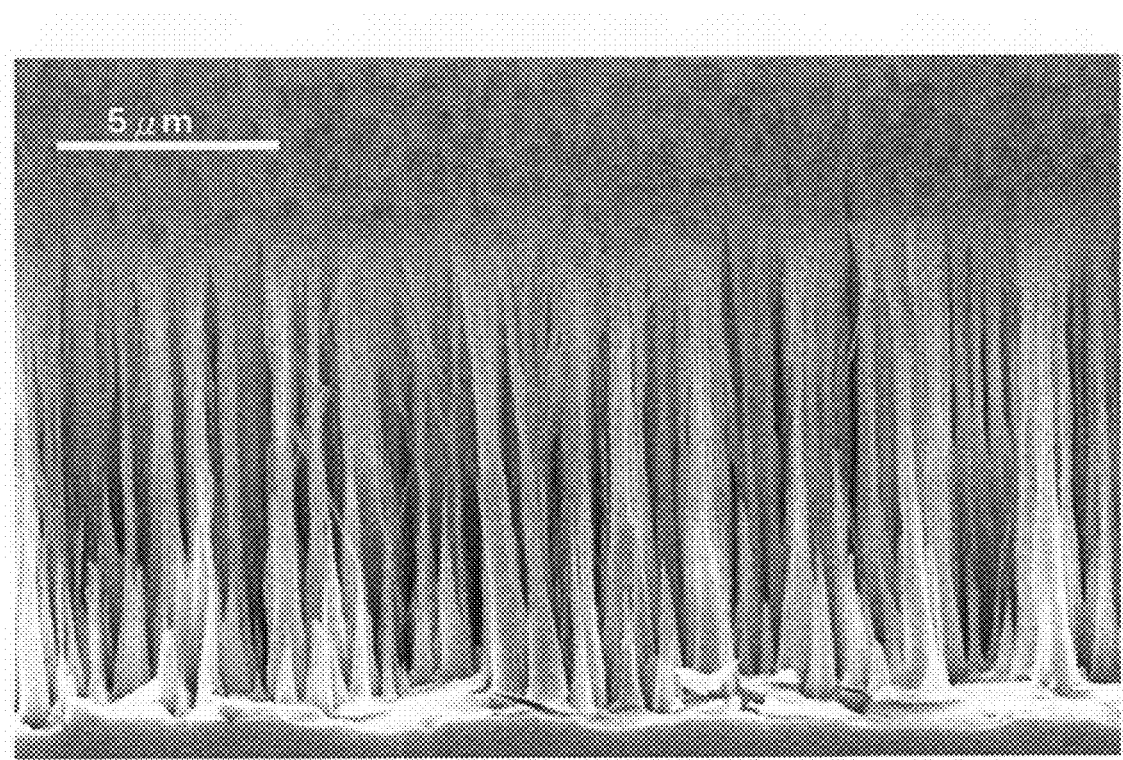

FIG. 6A and FIG. 6B are graphs illustrating the morphology change above concave free-standing GaN substrate at different etching time. FIG. 6A shows the morphology above substrate when the etching time is 7 minutes, and it is found that many rods are been generated. As shown in FIG. 6B, when the etching time is increased to 49 minutes, the length of rod will become longer.

Figure 7A:
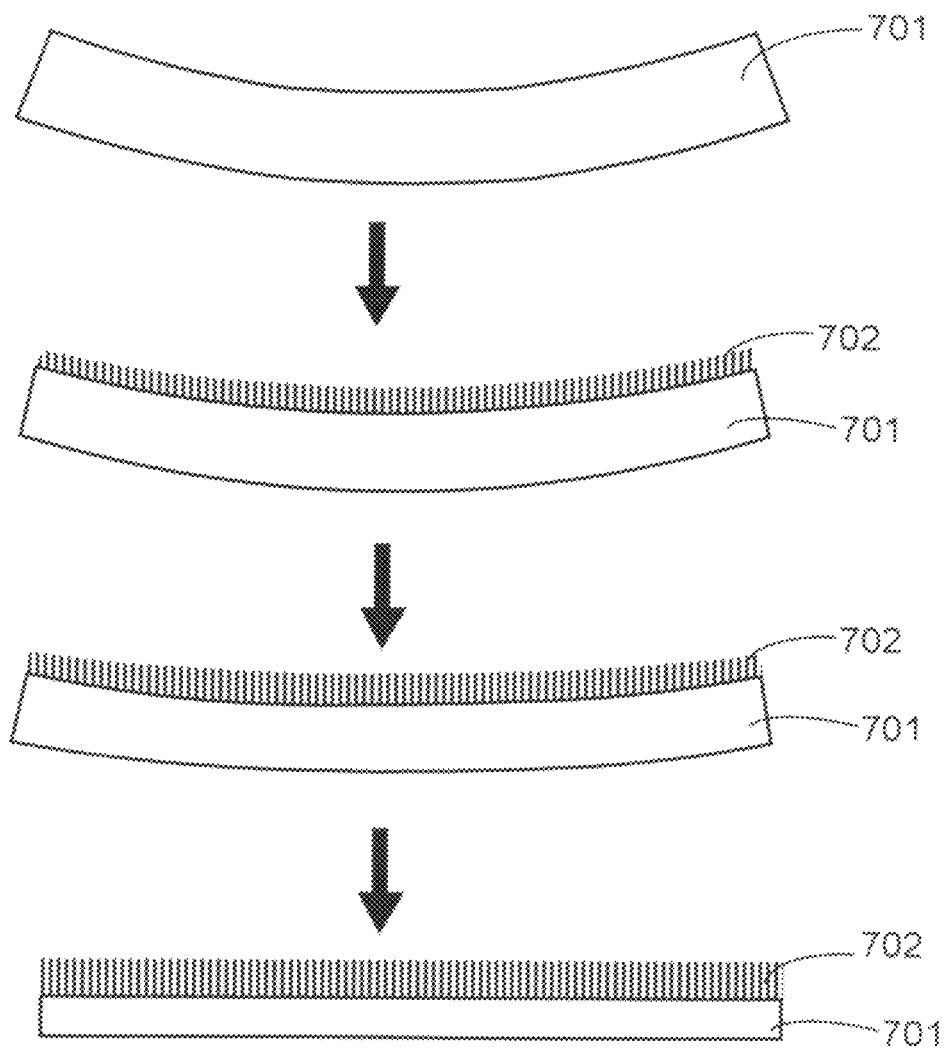
FIG. 7A shows the side view of concave free-standing gallium nitride substrate after etching.

FIG. 7A shows the side view of concave free-standing GaN substrate 701 after the etching process. The convex free-standing gallium nitride substrate 701 is provided, and using a dry etching method to etch a top of the convex free-standing gallium nitride substrate 301. Due to the stress above free-standing gallium nitride substrate 701 is released by the rod-type structure 702, so that the bowing level is decreased gradually.

Figure 7B:
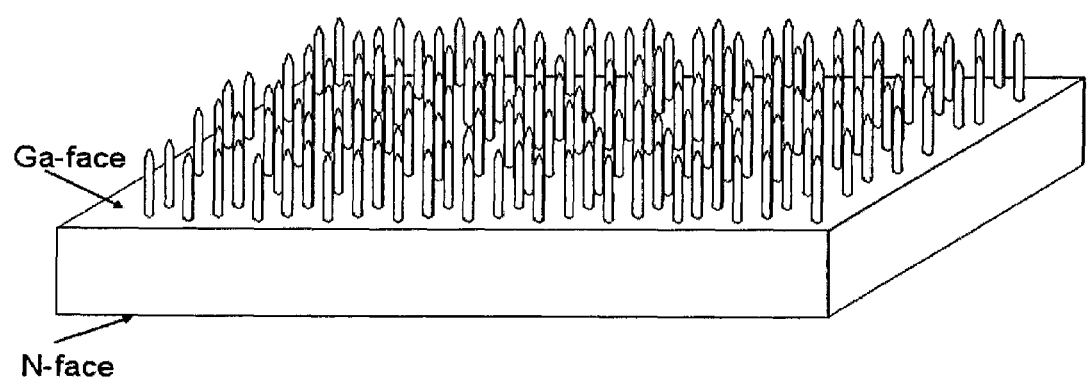
FIG. 7B shows the bowing of concave free-standing gallium nitride substrate and the isometric view of rod-type structure.

FIG. 7B shows the bowing of concave free-standing GaN substrate 701 and the isometric view of rod-type structure 702. Therefore, this etching method can decrease the bowing of free-standing GaN substrate 701, which will not break the substrate 701 body, resulting in smoothing free-standing GaN substrate 701.

Figure 8A:
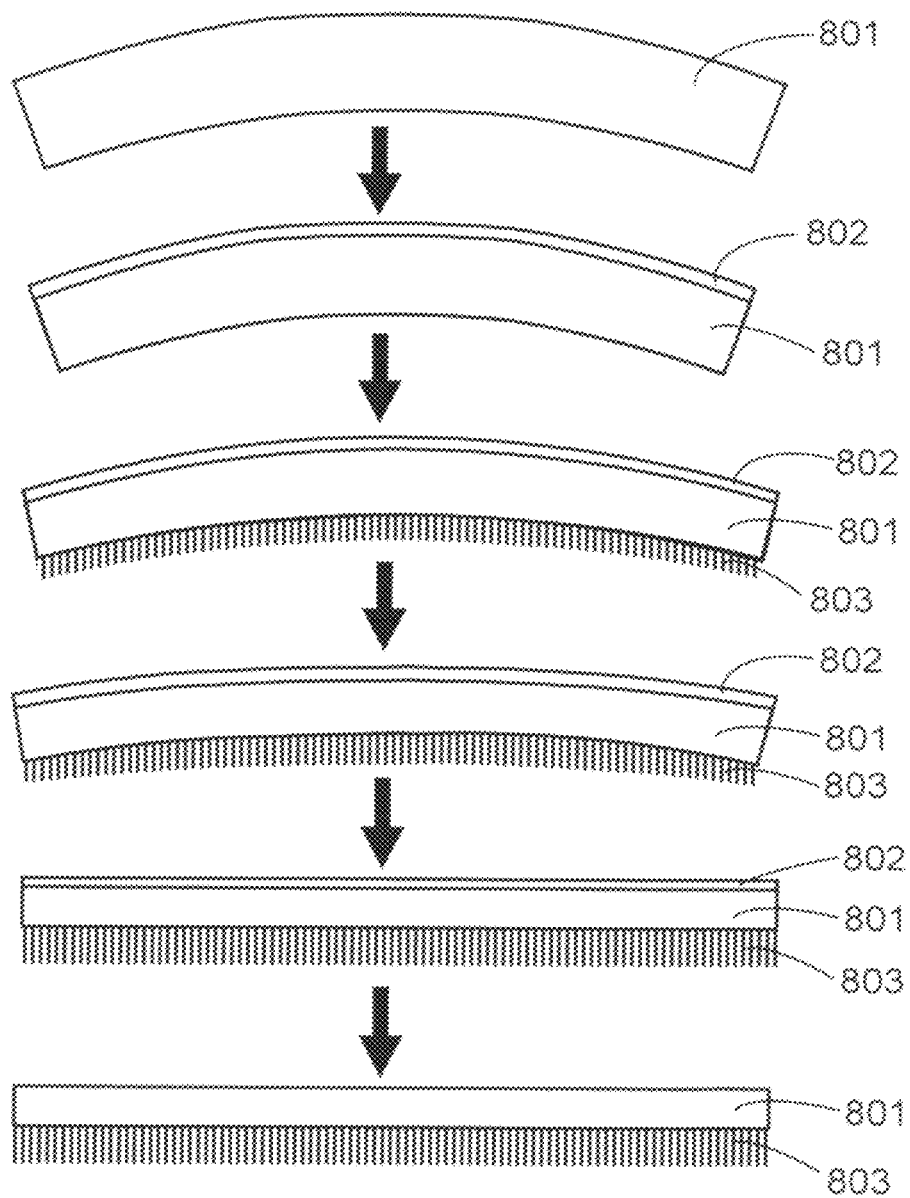
FIG. 8A shows the side view of convex free-standing gallium nitride substrate after etching.

Embodiment 3:

The invention discloses a method for smoothing a group III nitride semiconductor substrate. FIG. 8A shows the side view of convex free-standing GaN substrate 801 after the etching process. Firstly, the convex free-standing GaN substrate 801 is provided, and sputtering (or depositing) a dielectric layer (or metal layer) 802 on a top of the convex free-standing GaN substrate 801. The wet etching (or electrochemical etching) method is used to etch the bottom of convex free-standing GaN substrate 801. Finally, the above-mentioned dielectric layer (or metal layer) 802 is removed.

Also, FIG. 8A shows the side view of convex free-standing GaN substrate 801 after etching. The rod-type structure, hole-type structure, or flat-type structure 803 on convex free-standing GaN substrate 801 will release the stress on convex free-standing GaN substrate 801, so that the bowing level will be decreased gradually.

Figure 8B:
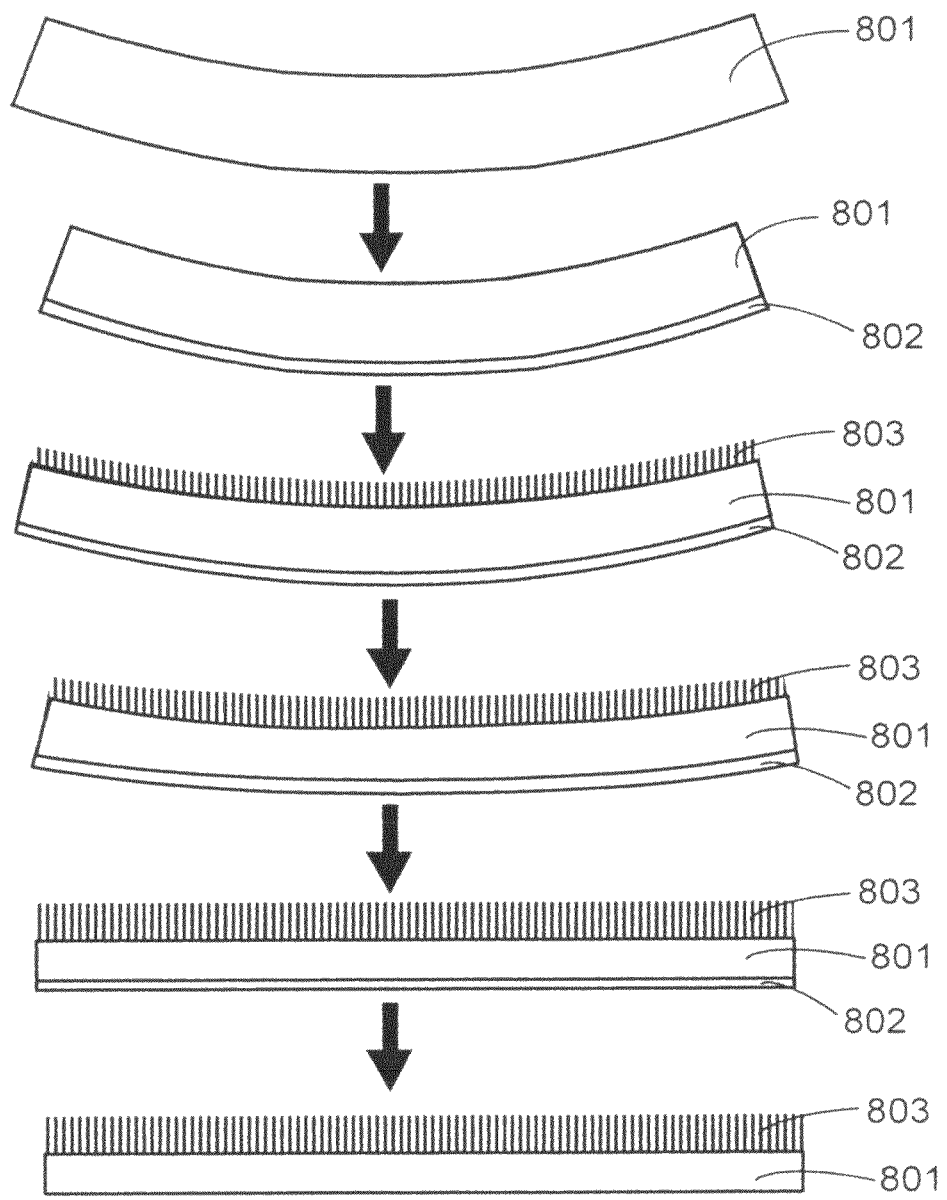
FIG. 8B shows the side view of concave free-standing gallium nitride substrate after etching.

The invention discloses a smoothing method to decrease bowing of group III nitride semiconductor substrate. FIG. 8B shows the side view of concave free-standing GaN substrate 801 after the etching process. Firstly, the concave free-standing GaN substrate 801 is provided, and sputtering (or depositing) a dielectric layer (or metal layer) 802 under the concave free-standing GaN substrate 801. The wet etching (or electrochemical etching) method is used to etch the top of the concave free-standing GaN substrate 801. Finally, the above-mentioned dielectric layer (or metal layer) 802 is removed.

FIG. 8B shows the side view of the concave free-standing GaN substrate 801 after the etching process. The rod-type structure, hole-type structure, or flat-type structure 803 on the convex free-standing GaN substrate 801 will release the stress on concave free-standing GaN substrate 801, so that the bowing level will be decreased gradually.

Figure 9A:
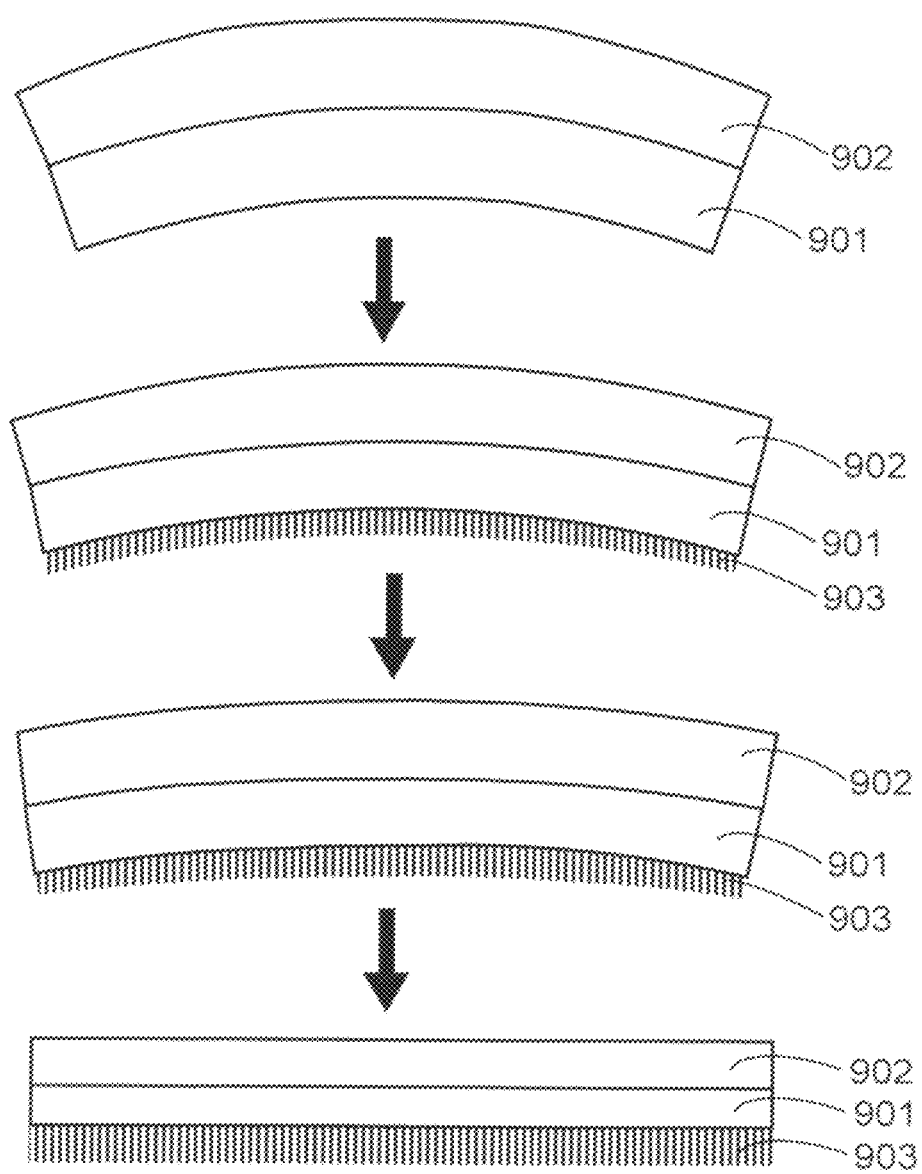
FIG. 9A shows the side view of convex gallium nitride epitaxy layer and heterogeneous substrate after etching.

Embodiment 4:

The invention discloses a method for smoothing a group III nitride semiconductor substrate. FIG. 9A shows the side view of the convex gallium nitride epitaxy layer 902 on the heterogeneous substrate 901 after the etching process. Firstly, the convex gallium nitride epitaxy layer 902 formed on the heterogeneous substrate 901 are provided. The gallium nitride epitaxy layer 902 and heterogeneous substrate 901 are connected without separation. The various etching methods (dry etching and wet etching) are used to etch the bottom of the heterogeneous substrate 901. The rod-type structure, hole-type structure, or flat-type structure 903 generated from etching will release the stress at the back of heterogeneous substrate 901, so that the bowing level will be decreased gradually.

Figure 9B:
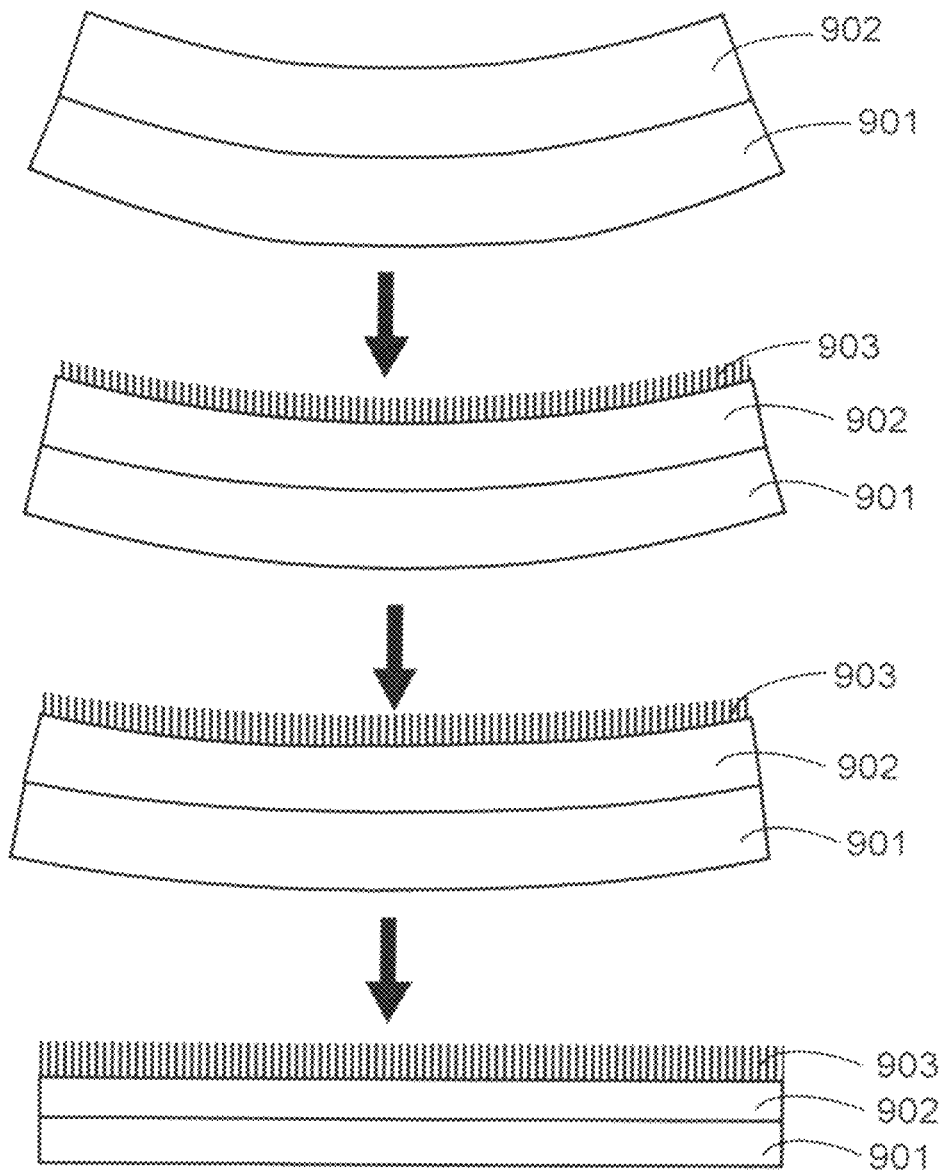
FIG. 9B shows the side view of concave gallium nitride epitaxy layer and heterogeneous substrate after etching.

The invention discloses a method for smoothing a group III nitride semiconductor substrate. FIG. 9B shows the side view of the concave gallium nitride epitaxy layer 902 and heterogeneous substrate 901 after the etching process. Firstly, the concave gallium nitride epitaxy layer 902 formed on the heterogeneous substrate 901 are provided. The concave gallium nitride epitaxy layer 902 and heterogeneous substrate 901 are connected without separation. The various etching methods including dry etching, wet etching and electrochemical etching are used to etch the top of the concave gallium nitride epitaxy layer 902. The rod-type structure, hole-type structure, or flat-type structure 903 generated from etching will release the stress at the back of the heterogeneous substrate 901, so that the bowing level will be decreased gradually, resulting in smoothing group III nitride semiconductor substrate.

The invention discloses a smoothing method to decrease bowing of group III nitride semiconductor substrate; it does not need tedious semiconductor process to significantly decrease the bowing phenomenon of group III nitride semiconductor substrate, resulting in smoothing effect. The invention can measure the bowing change of group III nitride semiconductor substrate or nitride epitaxy layer very instant, in order to carry on flexible adjustment at suitable time. The invention can be used before or after the chemical grinding process, and other process stage. The use of the above-mentioned structure will be better for the follow-up application of substrate, such as the application of grinding and epitaxy. It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method smoothing a group III nitride semiconductor substrate, comprising:
   providing a convex free-standing gallium nitride substrate;
   forming a dielectric layer on a top of said convex free-standing gallium nitride substrate;
   using a wet etching method to etch a bottom of said convex free-standing gallium nitride substrate: and
   removing said dielectric layer.

2. The method for smoothing said group III nitride semiconductor substrate according to claim 1, wherein said dielectric layer further comprises a metal layer.

3. The method for smoothing said group III nitride semiconductor substrate according to claim 1, wherein said wet etching method further comprises an electrochemical etching method.

4. A method for smoothing a of group III nitride semiconductor substrate, comprising:
   providing a concave free-standing gallium nitride substrate;
   forming a dielectric layer under said concave free-standing gallium nitride substrate;
   using a wet etching method to etch a top of said concave free-standing gallium nitride substrate; and
   removing said dielectric layer.

5. The method for smoothing said group III nitride semiconductor substrate according to claim 4, wherein the dielectric layer comprises a metal layer.

6. The method for smoothing said group III nitride semiconductor substrate according to claim 4, wherein the wet etching method comprises an electrochemical etching method.

* * * * *